United States Patent
Lin et al.

(10) Patent No.: US 6,764,866 B1
(45) Date of Patent: Jul. 20, 2004

(54) SYSTEM AND METHOD FOR QUALIFYING MULTIPLE DEVICE UNDER TEST (DUT) TEST HEAD

(75) Inventors: Lee-Chung Lin, Pingtung (TW); Jun-Hao Huang, Feng Shan (TW); Chun-Chieh Hsiao, Tainan (TW)

(73) Assignee: Taiwan SEmiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/370,825

(22) Filed: Feb. 21, 2003

(51) Int. Cl.[7] ............................................. H01L 21/66
(52) U.S. Cl. .......................................... 438/11; 438/18
(58) Field of Search ........................... 438/4, 5, 10, 11, 438/17, 18

(56) References Cited

U.S. PATENT DOCUMENTS

| | | | |
|---|---|---|---|
| 5,103,557 A | * 4/1992 | Leedy | 438/4 |
| 5,923,178 A | 7/1999 | Higgins et al. | 324/754 |
| 6,210,984 B1 | * 4/2001 | Farnworth et al. | 438/10 |
| 6,356,098 B1 | 3/2002 | Akram et al. | 324/765 |
| 6,396,712 B1 | * 5/2002 | Kuijk | 439/91 |
| 6,480,978 B1 | 11/2002 | Roy et al. | 714/724 |
| 6,605,479 B1 | * 8/2003 | Pasadyn et al. | 438/18 |

* cited by examiner

*Primary Examiner*—Chandra Chaudhari
(74) *Attorney, Agent, or Firm*—Tung & Associates

(57) ABSTRACT

Each of a system for qualifying a multiple die under test head and a system for qualifying the multiple die under test head employ selection of a sub-set of die arrays within a calibration standard substrate. The sub-set of die arrays is selected such as to: (1) not overlap in position within the calibration standard substrate; and (2) have in an aggregate no greater than one defective die within each of a series of die locations. The system and the method provide for accurate and efficient qualification of the multiple die under test head and thus accurate and efficient electrical test measurement of a microelectronic product.

14 Claims, 3 Drawing Sheets

SYSTEM AND METHOD FOR QUALIFYING MULTIPLE DEVICE UNDER TEST (DUT) TEST HEAD

BACKGROUND OF THE INVENTION

1. Field of the Invention

The invention relates generally to calibration and quality assurance of test apparatus employed for testing microelectronic substrates. More particularly, the present invention relates to efficient and accurate calibration and quality assurance of test apparatus employed for fabricating microelectronic substrates.

2. Description of the Related Art

Common in the microelectronic product fabrication art is the use of test apparatus for electrically testing microelectronic substrates. Microelectronic substrates may be electrically tested in-line prior to their complete fabrication into microelectronic products. Alternatively, microelectronic substrates may be electrically tested subsequent to their complete fabrication into microelectronic products.

While electrical testing of microelectronic substrates is clearly desirable and often essential in the microelectronic product fabrication art, it is nonetheless not entirely without problems. In that regard, it is often difficult to accurately and efficiently electrically test microelectronic substrates.

It is towards the foregoing object that the present invention is directed.

Various apparatus, systems and methods have been disclosed in the microelectronic product fabrication art for electrically testing microelectronic substrates. Included but not limited among the apparatus, systems and methods are those disclosed within: (1) Higgins et al., in U.S. Pat. No. 6,923,178 (an electrical probe apparatus and electrical test method which provide enhanced probe needle to microelectronic substrate contact, absent scrubbing, when electrically testing a microelectronic substrate); (2) Akram et al., in U.S. Pat. No. 6,356,098 (an electrical probe card apparatus, system and method which employ a physical biasing when testing a microelectronic substrate); and (3) Roy et al., in U.S. Pat. No. 6,480,978 (an electrical test method which employs inter-device under test and intra-device under test comparisons).

Desirable are apparatus, systems and methods for accurately and efficiently electrically testing microelectronic substrates.

It is towards the foregoing object that the present invention is directed.

SUMMARY OF THE INVENTION

A first object of the invention is to provide a system for testing a microelectronic substrate and a method for testing the microelectronic substrate.

A second object of the invention is to provide a system and a method in accord with the first object of the invention, wherein the microelectronic substrate is accurately and efficiently tested.

In accord with the objects of the invention, the invention provides a method for calibrating a multiple die under test head for use when electrically testing a microelectronic substrate and a system for calibrating the multiple die under test head for use when electrically testing the microelectronic substrate.

The method first provides a microelectronic test apparatus comprising a multiple die under test head. The method also provides a calibration standard substrate having a plurality of die arrays which may be tested while employing the multiple die under test head. The method further provides for classifying the plurality of die arrays with respect to: (1) position within the calibration standard substrate; and (2) defective die and non-defective die within a series of die locations within each of the plurality of die arrays. The method then provides for selecting from the plurality of die arrays a sub-set of die arrays which: (1) do not overlap in position within the calibration standard substrate; and (2) have in an aggregate no greater than one defective die within each of the series of die locations. Finally, the method provides for qualifying the multiple die under test head through measurement of the sub-set of die arrays.

The method in accord with the invention contemplates a system in accord with the invention.

The invention provides a system for testing a microelectronic substrate and a method for testing the microelectronic substrate, wherein the microelectronic substrate is accurately and efficiently tested.

The invention generally realizes the foregoing object within the context of a method for qualifying a multiple die under test head employed within an electrical test apparatus employed for testing a microelectronic substrate and a system for qualifying the multiple die under test head employed within the electrical test apparatus employed for testing the microelectronic substrate. The invention more specifically realizes the foregoing object by: (1) classifying a plurality of die arrays within a calibration standard substrate with respect to: (a) position within the calibration standard substrate; and (b) defective die and non-defective die within a series of die locations within each of the plurality of die arrays, such that there may be: (2) selected from the plurality of die arrays a sub-set of arrays which: (a) do not overlap within the calibration standard substrate; and (b) have in an aggregate no greater than one defective die-within each of the series of die locations. The sub-set of die arrays may then be employed for qualifying the multiple die under test head with enhanced accuracy and efficiency since the sub-set of die arrays comprises an increased number of non-defective dies.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a system for testing a microelectronic substrate and a method for testing the microelectronic substrate, wherein the microelectronic substrate is accurately and efficiently tested.

The invention generally realizes the foregoing object within the context of a method for qualifying a multiple die under test head employed within an electrical test apparatus employed for testing a microelectronic substrate and a system for qualifying the multiple die under test head employed within the electrical test apparatus employed for testing the microelectronic substrate. The invention more specifically realizes the foregoing object by: (1) classifying a plurality of die arrays within a calibration standard substrate with respect to: (a) position within the calibration standard substrate; and (b) defective die and non-defective die within a series of die locations within each of the plurality of die arrays, such that there may be: (2) selected from the plurality of die arrays a sub-set of arrays which: (a) do not overlap within the calibration standard substrate; and (b) have in an aggregate no greater than one defective die within each of the series of die locations. The sub-set of die arrays may then be employed for qualifying the multiple die under test head with enhanced accuracy and efficiency since the sub-set of die arrays comprises an increased number of non-defective dies.

Figure 1:
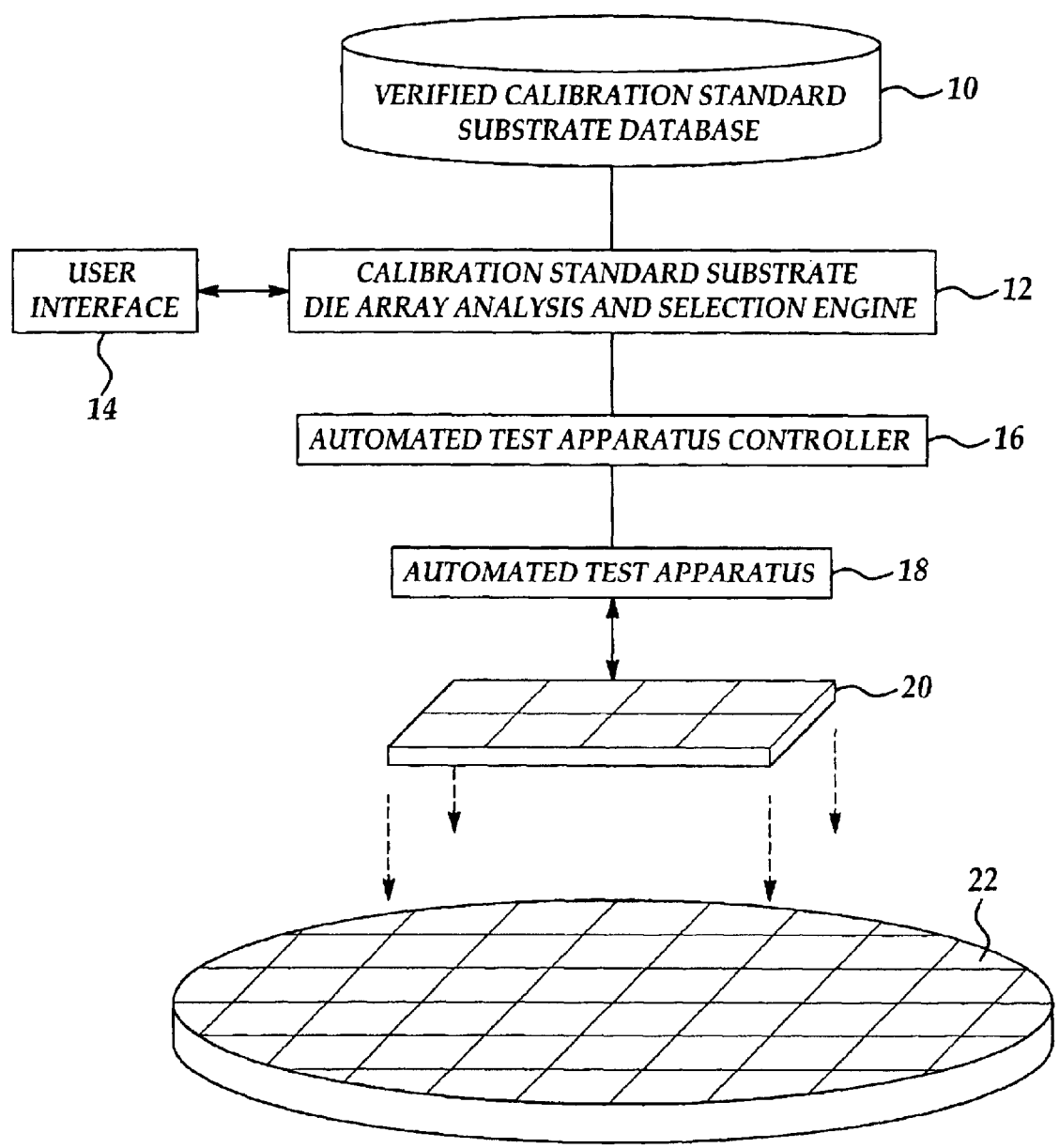
FIG. 1 shows a schematic diagram of a system in accord with the invention.

FIG. 1 shows a schematic block diagram of a system in accord with the invention.

FIG. 1 illustrates a verified calibration standard substrate database 10 which has contained therein data and information pertaining to a series of verified calibration standard substrates which may be employed for qualifying a multiple device under test (DUT) test head employed within an electrical test apparatus employed for testing a microelectronic substrate. The multiple device under test head may alternatively often referred to as a test card. The multiple device under test head (or test card) may be employed in electrically testing microelectronic products including but not limited to semiconductor products and ceramic substrate products.

Also shown within FIG. 1 is a calibration standard substrate die array analysis and selection engine which undertakes, within the context of the invention, analysis and selection of a certain series of die arrays within a calibration standard substrate in accord with the invention. Specific rules and algorithms for such analysis and selection are discussed below in greater detail.

As is further illustrated within FIG. 1, the calibration standard substrate die array analysis and selection engine drives an automated test apparatus controller 16 which in turn controls an automated test apparatus 18 which further in turn positions a multiple die under test head 16 with respect to a selected series of die arrays within a calibration standard substrate 20.

Within the invention, the automated test apparatus controller 16, the automated test apparatus 18, the multiple die under test head 20 and the calibration standard substrate 22 may be otherwise generally conventional in the microelectronic product fabrication art and electrical test art. The multiple die under test head 20 will typically accommodate an areal die array comprising from about 4 to about 20 die, but the invention is not intended to be limited to a multiple device under test head which accommodates only an areal die array comprising a number of die in that range. Within the invention, the calibration standard substrate 22 is a calibration standard substrate within which die arrays have been analyzed and selected through operation of the calibration standard substrate die array analysis and selection engine 12 as illustrated in FIG. 1.

As is further illustrated within FIG. 1 the calibration standard substrate die array analysis and selection engine 12 has further associated therewith a user interface 14 which is otherwise generally conventional in the microelectronic fabrication art and electrical test art. The user interface 13 may include components such as but not limited to graphical user interface components and keyboard user interface components.

Within the invention, the system as illustrated in FIG. 1 is intended as a computer assisted system, typically a digital computer assisted system. Within the computer assisted system, the. verified calibration standard substrate database 10 is typically a disk drive database and the calibration standard substrate die array analysis and selection engine 12 will typically comprise a computer processor which processes data and information from the verified calibration standard substrate database 10 in accord with computer algorithms in accord with the invention.

Figure 2:
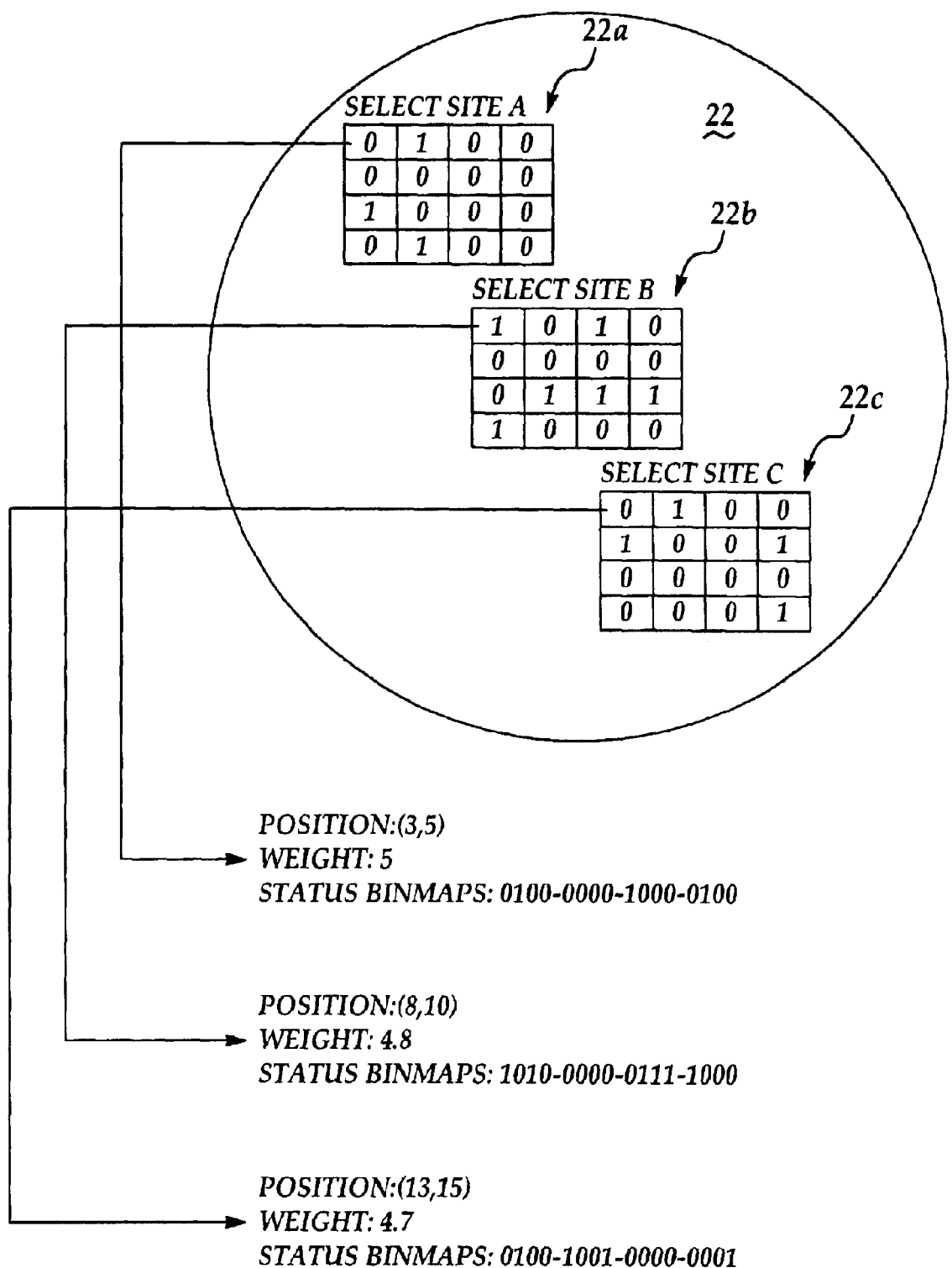
FIG. 2 shows a schematic plan view diagram of a calibration standard substrate having defined therein a plurality of die arrays which may be classified in accord with the invention.

FIG. 2 shows a schematic plan view diagram of a calibration standard substrate 22 correlating with the calibration standard substrate 22 as illustrated in FIG. 1, but within which a series of die arrays 22a, 22b and 22c has been defined, analyzed and classified in accord with the invention.

Within the invention, each of the series of die arrays 22a, 22b and 22c is first classified with respect to its position within the calibration standard substrate 22. Such position classification may be effected by a row and column designation for a corner (such as an upper left hand corner) die location within each of the series of die arrays 22a, 22b and 22c.

The present invention also provides for classifying each of the die arrays 22a, 22b and 22c with respect to defective die and non-defective die within a series of die locations within each of the series of die arrays 22a, 22b and 22c. The invention effects the foregoing result by transforming non-defective die (i.e., "1") and defective die (i.e., "0") into a linear status binmap or bitmap as illustrated in FIG. 2.

Finally, each of the series of die arrays 22a, 22b and 22c may optionally be accorded a weighting for purposes of further analysis by the calibration standard substrate die array analysis and selection engine as illustrated in FIG. 1. Such weighting may be based upon die array position within a calibration standard substrate, percentage of non-defective or defective die within a die array, or an alternative factor which may be employed for discriminating die arrays in accord with the invention.

Figure 3:
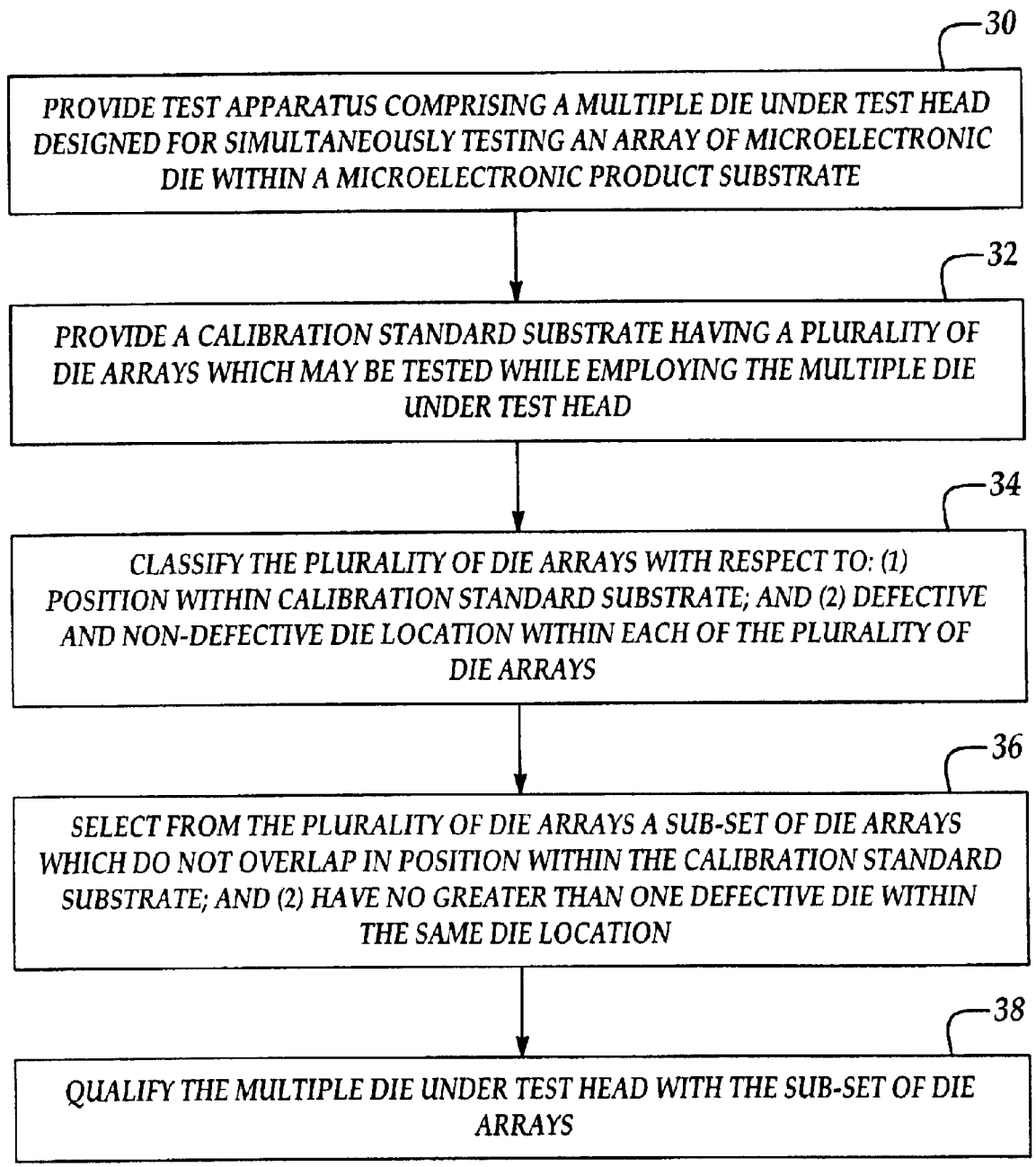
FIG. 3 shows a schematic block diagram illustrating a series of process steps in accord with a of the invention.

FIG. 3 shows a process flow diagram illustrating a series of process steps in accord with a method of the invention.

In accord with the process step which corresponds with reference numeral 30, the invention first provides a microelectronic test apparatus comprising a multiple die under test head designed for simultaneously testing a microelectronic die array within a microelectronic product substrate.

Within the method, the multiple die under test head is otherwise analogous, equivalent or identical to the multiple die under test head 20 as illustrated in FIG. 1.

In accord with the process step which corresponds with reference numeral 32, the method also provides a calibration standard substrate having a plurality of die arrays which may be tested while employing the multiple die under test head.

Within the method, the calibration standard substrate corresponds with the calibration standard substrate 22 as illustrated in FIG. 1 or FIG. 2.

In accord with the process step which corresponds with reference numeral 34, the method next provides for classification of the plurality of die arrays with respect to: (1) position within the calibration standard substrate; and (2) defective die and non-defective die within a series of die locations within each of the plurality of die arrays.

Within the method, such classification is illustrated with respect to the series of die arrays 22a, 22b and 22c as illustrated within the schematic diagram of FIG. 2.

In accord with the process step which corresponds with reference numeral 36, the method next provides for selecting from the plurality of die arrays a sub-set of die arrays which: (1) do not overlap in position within the calibration standard substrate; and (2) have in an aggregate no greater than one defective die within each of the series of die locations.

Within the method, a determination of overlap of a first die array with a second die array within the calibration standard substrate is readily made by: (1) determining separation of a pair of die array by determining a pair of coordinates for each of a pair of geometrically corresponding die with a pair of die arrays; and (2) comparing the separation of the pair of die arrays to the areal dimensions of the die arrays.

Within the method, a quantification of defective die within each of a series of corresponding die locations within a series of die arrays may be determined by summing a corresponding series of binmaps or bitmaps as illustrated within FIG. 2 for the series of die arrays 22a, 22b and 22c.

In accord with the process step which corresponds with reference numeral 38, the invention finally provides for qualifying the multiple die under test head with the sub-set of die arrays which fulfill the pair of conditions provided within the process step which corresponds with reference numeral 36.

Within the invention, the qualification of the multiple die under test head is intended as determined by a correlation of expected non-defective die and defective die. In accord with the process step which corresponds with reference numeral 36, an aggregate of defective die within any specific die location within a sub-set of die arrays should not exceed unity. An increased unexpected number of defective die provide basis for disqualification of a multiple die under test head in accord with the invention.

The foregoing disclosure provides a system for qualifying a multiple die under test head and a method for qualifying the multiple die under test head, where each of the system and the method provide for accurately and efficiently qualifying the multiple die under test head such that a microelectronic substrate may be accurately and efficiently tested while employing the multiple die under test head.

The invention realizes the foregoing object by: (1) classifying a plurality of die arrays within a calibration standard substrate with respect to: (a) position within the calibration standard substrate; and (b) defective die and non-defective die within a series of die locations within each of the plurality of die arrays, such that there may be: (2) selected from the plurality of die arrays a sub-set of arrays which: (a) do not overlap within the calibration standard substrate; and (b) have in an aggregate no greater than one defective die within each of the series of die locations. The sub-set of die arrays may then be employed for qualifying the multiple die under test head with enhanced accuracy and efficiency since the sub-set of die arrays comprises an increased number of non-defective dies.

The preferred embodiment of the invention is illustrative of the invention rather than limiting of the invention. Revisions and modifications may be made to parameters and limitations within the context of the preferred embodiment of the invention while still providing an embodiment of the invention, in accord with the accompanying claims.

What is claimed is:

1. A method for qualifying a multiple die under test head comprising:

providing a test apparatus comprising a multiple die under test head;

providing a calibration standard substrate having a plurality of die arrays which may be tested while employing the multiple die under test head;

classifying the plurality of die arrays with respect to:
position within the calibration standard substrate; and
defective die and non-defective die within a series of die locations within each of the plurality of die arrays;

selecting from the plurality of die arrays a sub-set of die arrays which:
do not overlap in position within the calibration standard substrate; and
have in an aggregate no greater than one defective die within each of the series of die locations; and qualifying the multiple die under test head through measurement of the sub-set of die arrays.

2. The method of claim 1 wherein multiple die under test head simultaneously electrically tests from about 4 to about 20 die.

3. The method of claim 1 wherein the calibration standard substrate is a semiconductor calibration standard substrate.

4. The method of claim 1 wherein the calibration standard substrate is a ceramic substrate calibration standard substrate.

5. The method of claim 1 wherein an overlap of a pair of die arrays is determined by a difference in a corresponding die location within a pair of die array, as compared with die array dimensions.

6. The method of claim 1 wherein classification of defective die and non-defective die within the series of die locations within each of the plurality of die arrays is provided in a bitmap fashion.

7. The method of claim 5 wherein a series of bitmaps for the sub-set of die arrays is added to provide the aggregate no greater than one defective die within each of the series of die locations.

8. A method for qualifying a multiple die under test head comprising:

providing a test apparatus comprising a multiple die under test head;

providing a calibration standard substrate having a plurality of die arrays which may be tested while employing the multiple die under test head;

classifying the plurality of die arrays with respect to:
position within the calibration standard substrate; and
defective die and non-defective die within a series of die locations within each of the plurality of die arrays;

selecting from the plurality of die arrays a sub-set of die arrays which:
do not overlap in position within the calibration standard substrate; and
have in an aggregate no greater than one defective die within each of the series of die locations; and electrically testing the sub-set of die arrays; and diqualifying the multiple die under test head if any of the series of die locations electrically test as greater than one defective die.

9. The method of claim 1 wherein multiple die under test head simultaneously electrically tests from about 4 to about 20 die.

10. The method of claim 1 wherein the calibration standard substrate is a semiconductor calibration standard substrate.

11. The method of claim 1 wherein the calibration standard substrate is a ceramic substrate calibration standard substrate.

12. The method of claim 1 wherein an overlap of a pair of die arrays is determined by a difference in a corresponding die location within a pair of die array, as compared with die array dimensions.

13. The method of claim 1 wherein classification of defective die and non-defective die within the series of die locations within each of the plurality of die arrays is provided in a bitmap fashion.

14. The method of claim 5 wherein a series of bitmaps for the sub-set of die arrays is added to provide the aggregate no greater than one defective die within each of the series of die locations.

* * * * *